United States Patent
Bogner

(10) Patent No.: US 9,224,499 B2
(45) Date of Patent: Dec. 29, 2015

(54) PRE-CHARGE SAMPLE-AND-HOLD CIRCUIT AND METHOD FOR PRE-CHARGING A SAMPLE-AND-HOLD CIRCUIT

(71) Applicant: Infineon Technologies AG, Neubiberg (DE)

(72) Inventor: Peter Bogner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 51 days.

(21) Appl. No.: 14/175,034

(22) Filed: Feb. 7, 2014

(65) Prior Publication Data

US 2015/0228355 A1 Aug. 13, 2015

(51) Int. Cl.
*H03M 1/00* (2006.01)
*G11C 27/02* (2006.01)
*H03M 1/12* (2006.01)

(52) U.S. Cl.
CPC ............ *G11C 27/026* (2013.01); *H03M 1/1245* (2013.01)

(58) Field of Classification Search
CPC .......... G11C 27/02; H03M 1/00; H03M 1/12; H03M 2201/13; H03M 2201/3178; H03M 1/1245; H03M 1/466; H03M 1/468
USPC .......................................... 341/122, 155, 156
See application file for complete search history.

(56) References Cited

U.S. PATENT DOCUMENTS

| | | | |
|---|---|---|---|
| 5,481,212 A * | 1/1996 | Shima | 327/94 |
| 5,982,205 A * | 11/1999 | Vallancourt | 327/94 |
| 6,134,313 A * | 10/2000 | Dorfman et al. | 379/201.01 |
| 6,529,049 B2 | 3/2003 | Erhart et al. | |
| 7,106,229 B1 * | 9/2006 | Chew | 341/118 |
| 7,375,664 B2 * | 5/2008 | Bilhan | 341/122 |
| 7,683,695 B2 * | 3/2010 | Sousa et al. | 327/382 |
| 2002/0167343 A1 | 11/2002 | Erhart et al. | |
| 2008/0180136 A1 | 7/2008 | Wu et al. | |
| 2012/0068766 A1 | 3/2012 | Buter et al. | |

FOREIGN PATENT DOCUMENTS

| | | |
|---|---|---|
| EP | 0910095 B1 | 5/2004 |
| EP | 0910096 B1 | 6/2006 |

OTHER PUBLICATIONS

Hsu et al, "A 33-mW 12-Bit 100-MHz Sample-and-Hold Amplifier," Department of Electronics Engineering National Chiao-Tung University, Taiwan, pp. 1-4.

\* cited by examiner

*Primary Examiner* — Jean B Jeanglaude
(74) *Attorney, Agent, or Firm* — Murphy, Bilak & Homiller, PLLC

(57) ABSTRACT

A precharge sample-and-hold circuit is provided that has an input terminal, a reference voltage terminal and an output terminal. The circuit has a sampling capacitance coupled between the input terminal and the reference voltage terminal. The sampling capacitance is configured to provide the sample voltage when the sample-and-hold circuit is in a holding mode. The circuit also has a cancellation capacitance. An analog/digital converter is provided that uses the precharge sample-and-hold circuit. A method to operate the precharge sample-and-hold circuit is also provided.

20 Claims, 6 Drawing Sheets

PRE-CHARGE SAMPLE-AND-HOLD CIRCUIT AND METHOD FOR PRE-CHARGING A SAMPLE-AND-HOLD CIRCUIT

BACKGROUND

Disclosed herein are techniques related to pre-charging a sample-and-hold circuit. A pre-charge sample-and-hold circuit can be used, for example, with an analog-to-digital converter (ADC). An input of an analog-to-digital converter can form a switched capacitor load. For example, an input of a successive-approximation register analog-to-digital converter (SAR-ADC) captures an analog input voltage signal with either an external sample/hold device or the SAR-ADC's internal sample/hold function. The SAR-ADC compares this input voltage to known fractions of the converter's external or internal voltage reference. The voltage reference sets the full-scale input voltage range of the converter. Modern SAR-ADCs use a capacitive digital-to-analog converter (C-DAC) to successively compare bit combinations and set or clear appropriate bits into a data register.

SUMMARY

In a first aspect a pre-charge sample-and-hold circuit is disclosed. The pre-charge sample-and-hold circuit has an input terminal configured to receive an input voltage signal, a reference voltage terminal configured to be set to a reference voltage, an output terminal configured to output a sample voltage, and a sampling capacitance. The sampling capacitance can be coupled between the input terminal and the reference voltage terminal. In some embodiments the sampling capacitance is configured to provide the sample voltage when the sample-and-hold circuit is in a holding mode, and a cancellation capacitance configured to be charged when the sample-and-hold circuit is in the holding mode and, when the sample-and-hold circuit is in a sampling mode, to charge the sampling capacitance. At least one effect can be that sampling capacitance as seen from the input terminal appears to be small.

In another aspect an analog-to-digital converter (ADC) is provided. The ADC comprises a sample-and-hold circuit according to the embodiments disclosed herein.

In yet another aspect a method for charging a sampling capacitance of a pre-charge sample-and-hold circuit is disclosed. The method comprises charging a cancellation capacitance when the sample-and-hold circuit is in a holding mode, and charging the sampling capacitance when the sample-and-hold circuit is in a sampling mode. In some embodiments charging the sampling capacitance uses charge on the cancellation capacitance.

This summary is submitted with the understanding that it will not be used to interpret or limit the scope or meaning of the claims. Those skilled in the art will recognise additional features and advantages upon reading the following detailed description, and upon viewing the accompanying drawings.

BRIEF DESCRIPTION OF THE DRAWINGS

The claimed subject matter is described in detail below with reference to the drawings. The detailed description references the accompanying figures. The same reference numerals are used throughout the drawings to reference like features and components. Where multiple embodiments are described, multi-digit reference numerals are used to denote elements of the embodiments. The least significant digits of the multi-digit reference numerals reference features and components that are alike in the various embodiments, whereas the most significant digit references the specific embodiment illustrated in the corresponding figure. For simplicity, like elements in the various embodiments will typically only be introduced when first mentioning the element in one embodiment. Having regard to the illustration of switches, the following drawing convention is used: open switches are shown with an "o", closed switches are illustrated without any "o".

DETAILED DESCRIPTION

Figure 1:
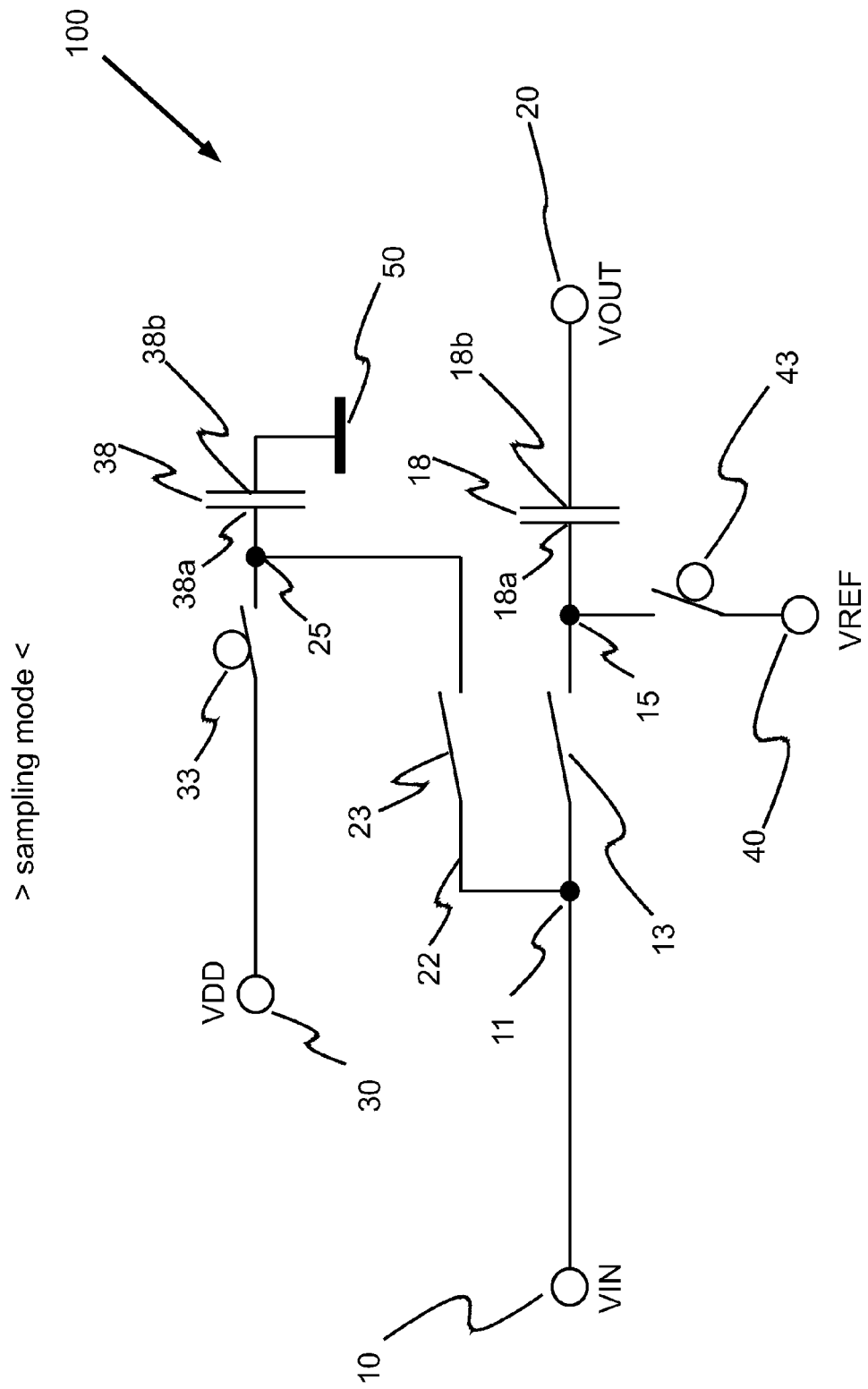
FIG. 1 is a diagram illustrating a pre-charge sample-and-hold circuit according to some embodiments.

For purposes of explanation, numerous specific details are set forth in order to provide a thorough understanding of the claimed subject matter. It may be evident, however, that the claimed subject matter may be practised without these specific details.

This disclosure is directed to techniques for implementing a pre-charge sample and hold circuit for use in an analog-to-digital converter (ADC), wherein the pre-charge sample-and-hold circuit has a so-called tank capacitance, herein also referred to as 'tank capacitor' or just 'tank', for use as a reservoir for charge to be used to load sampling capacitors in the ADC, collectively referred to as sampling capacitance. Techniques described herein use a further capacitance in place or in addition to other elements in the conventional pre-charge sample-and-hold circuit. The capacitance element is configured to reduce a current from a high-resistance input circuit to the pre-charge sample and hold circuit. At least one effect can be to lower an amount of charge taken from the tank capacitor when compared with conventional solutions. Thus, in some embodiments power can be saved since less charge needs to be replaced in the tank capacitance. At least one effect can be increased precision when compared with conventional passive solutions and decreased power consumption when compared with conventional active solutions. Some techniques described herein use the further capacitance element in place of or as complement to an active circuit element. Thus power savings can be achieved when compared with a conventional solution that uses the active circuit element.

At an input of a SAR analog-to-digital converter (SAR-ADC, herein also SAR converter), an input signal first 'sees' a switch wherein a closed switch creates a switch resistance in series with a capacitive array. One terminal ('comparator side terminal') of these capacitors couples to an inverting input of a comparator. Another terminal ('reference side terminal') can tie into input voltage, voltage reference, or ground. Initially, the reference side terminal couples to the input signal. Once the capacitive array completely acquired the input signal, an input switch opens and the SAR converter starts a conversion process. During the conversion process, the reference side terminal of a capacitor associated with a most significant bit (MSB) in a digital representation of the analog signal connects to the voltage reference while the other capacitors connect to ground. This action redistributes charge among all the capacitors. The comparator's inverting input moves up or down in voltage according to charge balancing. If the voltage at the inverting input of the comparator is greater than half the voltage reference, the converter assigns "0" to the MSB and transmits that value out of a serial port of the SAR-ADC. If this voltage is less than half the voltage reference, the converter transmits a value "1" out of the serial port, and the converter connects the MSB capacitor to ground. Following the MSB assignment, this process repeats with the MSB-1 capacitor. The time required for the SAR-ADC conversion process to occur consists of the acquisition and conversion time. At the conclusion of the total conversion process, the SAR-ADC can enter a sleep mode.

An ADC driver circuit can use an operational amplifier (op amp) to separate the SAR-ADC from a high impedance input source, VSIG. An R/C low-pass circuit (RISO and CISO) can follow to perform functions going back to the op amp and forward to the SAR-ADC. A resistance of the low-pass circuit keeps the amplifier stable by isolating the amplifier's output stage from a capacitance of the low-pass circuit. The capacitance of the low-pass circuit provides a stable input source to the SAR-ADC. The capacitance tracks the voltage's input signal and provides the appropriate SAR-ADC charge during the converter's acquisition time.

In order to allow for settling of the switched capacitor load during sampling time an external capacitor (herein also referred to as 'tank capacitor') can be provided with the ADC. Loading of the ADC's switched capacitor load takes charge out of the tank capacitor. In order to provide sufficient charge, capacitance values for the tank capacitor are higher than for the switched capacitor load. One solution provides a tank capacitor connected in series with a filter resistor connecting to the ADC as an input circuit to the ADC. In certain applications filter bandwidth, fixed size of the filter resistor, sampling rate and size of the switched capacitor load limit the design. Therefore, a buffer can be contemplated to avoid taking charge out of tank capacitor during sampling. The filter resistor and the tank capacitor form a low pass filter and an anti-aliasing filter. The filter resistor is also used to protect the controller against high voltages. Using a small filter resistor in case of a failure an input line high currents can be injected. In another ADC, an input voltage to the ADC can also be provided by a high-ohm resistor which, however, pushes up the charging time that is needed to charge the sampling capacitor.

FIG. 1 illustrates a pre-charge sample-and-hold circuit 100 according to some embodiments. For example, pre-charge sample-and-hold circuit 100 can be configured for use with an analog-to-digital converter ADC (not shown). Pre-charge sample-and-hold circuit 100 comprises a signal input terminal 10 configured to receive an input voltage signal VIN. In some implementations input voltage signal VIN is an analog signal that can vary with time. Input voltage signal VIN can be provided to be digitized by the ADC. In some embodiments, seen from signal input terminal 10, pre-charge sample-and-hold circuit 100 is a high-impedance circuit. In some embodiments the high-impedance can be at least 10 KΩ.

Coupled to signal input terminal 10 in a propagation direction of an incoming input voltage signal VIN, the propagation direction herein also referred to as 'downstream' (and the opposite direction consequentially being referred to as 'upstream'), pre-charge sample-and-hold circuit 100 comprises a sampling switch 13 configured to be closed in an acquisition state of pre-charge sample-and-hold circuit 100 (as shown in FIG. 1), i.e., when pre-charge sample-and-hold circuit 100 is operated in a 'sampling mode'. Further, sampling switch 13 is configured to be open in a hold state of pre-charge sample-and-hold circuit 100, i.e., when pre-charge sample-and-hold circuit 100 is operated in a 'holding mode'. The term 'switch' as used herein encompasses any circuit element and circuitry that can provide functionality associated with operating or otherwise controlling the switch to make or break or to enable or disable an electrical line or other physical structure for transmission of signal from one point on the line to another point of the line on either side of the switch. In some embodiments a switch, for example, is implemented as a transistor.

Further, coupled to sampling switch 13 in the downstream direction, pre-charge sample-and-hold circuit 100 comprises a sampling capacitance 18 having an upstream terminal 18a and a downstream terminal 18b. During acquisition state, i.e., when operating in the sampling mode, a voltage at upstream terminal 18a on sampling capacitance 18 is configured to follow input voltage signal VIN.

Downstream of, and coupled to sampling capacitance 18, pre-charge sample-and-hold circuit 100 comprises a signal output terminal 20 configured to output a sampled voltage signal VOUT (also referred to as bias voltage) from pre-charge sample-and-hold circuit 100 for further processing by the ADC or, as the case may be, by other circuitry.

Pre-charge sample-and-hold circuit 100 further includes a reference voltage terminal 40 configured to be set to a reference voltage VREF. Reference voltage terminal 40 is coupled to a connection node 15 between sample switch 13 and sample capacitance 18. In some embodiments reference voltage VREF is preselected; for example, reference voltage VREF can be preselected to be equal to ground voltage if reference voltage terminal 40 is grounded. A reference voltage switch 43 is coupled between connection node 15 and reference voltage terminal 40. Reference switch 43 is configured to be open during the acquisition state, i.e., when operating pre-charge sample-and-hold circuit 100 in the sampling mode, and to be closed during the hold state. In some embodiments sampling capacitance 18, during hold state, is thus configured to hold reference voltage VREF at the upstream terminal 18a, and further configured to hold a sampling output voltage VOUT on downstream terminal 18b, wherein a level of sampling output voltage VOUT depends on an amount of charge loaded on sampling capacitance 18. As the case may be, leakage of charge can occur from sampling capacitance 18 so that, during the hold state, sampling capacitance 18 is discharged and sampling output voltage VOUT drops. In a typical implementation a drop of sampling output voltage VOUT can be undesired. As will be seen below, at least one effect of the techniques described herein can be to mitigate disadvantages associated with leakage of charge from sampling capacitance 18 and associated effects on sample output voltage VOUT.

Pre-charge sample-and-hold circuit 100 comprises charge cancellation circuitry including a cancellation capacitance 38. Forming part of the charge cancellation circuitry of pre-charge sample-and-hold circuit 100, pre-charge sample-and-hold circuit 100 comprises a power supply terminal 30 configured to be set to a supply voltage VDD. In some embodiments supply voltage VDD is to be larger than a maximum input voltage VIN. In typical embodiments supply voltage VDD is variable. In some embodiments supply voltage VDD is regulated depending on VIN. Cancellation capacitance 38 can be coupled between supply voltage terminal 30 and sampling capacitance 18.

Coupled to power supply terminal 30, pre-charge sample-and-hold circuit 100 further comprises a power supply switch 33 configured to be closed in the acquisition state (as is shown in FIG. 1) of pre-charge sample-and-hold circuit 100 and to be open in the hold state of pre-charge sample-and-hold circuit 100.

Coupled to power supply switch 33, pre-charge sample-and-hold circuit 100 further comprises the cancellation capacitance 38. Cancellation capacitance 38 has a charge/discharge terminal 38a that, in the hold state, is coupled to power supply switch 33. Further, cancellation capacitance 38 has a ground terminal 38b that is coupled to ground 50. It should be understood that ground terminal 38b can also be set to any other fixed voltage level than ground such as reference voltage VREF at reference voltage terminal 40.

Pre-charge sample-and-hold circuit 100 further includes a cancellation coupling 22 arranged, in some embodiments as a line, between voltage input terminal 10 and cancellation capacitance 38. In an embodiment cancellation coupling 22, at one end, connects a branch node 11 between voltage input terminal 10 and sampling switch 13 with, at another end, a junction 25 between cancellation capacitance 38 and power supply switch 33. Cancellation coupling 22 comprises a cancellation switch 23 that is configured to be closed during the acquisition state and open during the hold state of pre-charge sample-and-hold circuit 100. Thus, cancellation coupling 22 is configured to enable charging of cancellation capacitance 38 using supply voltage VDD while pre-charge sample-and-hold circuit 100 is in the hold state and cancellation switch 23 is open.

In some embodiments supply voltage VDD is selected to be larger than the level of input voltage signal VIN. For example, supply voltage VDD can be double a maximum voltage of input voltage signal VIN. While pre-charge sample-and-hold circuit 100 is in the acquisition state, cancellation coupling 22 is configured to enable discharging cancellation capacitance 38 to charge sampling capacitance 18, since charge on cancellation capacitance 38 can flow from charge/discharge terminal 38a via cancellation coupling 22 to upstream terminal 18a of sampling capacitance 18, and vice versa.

Figure 2:
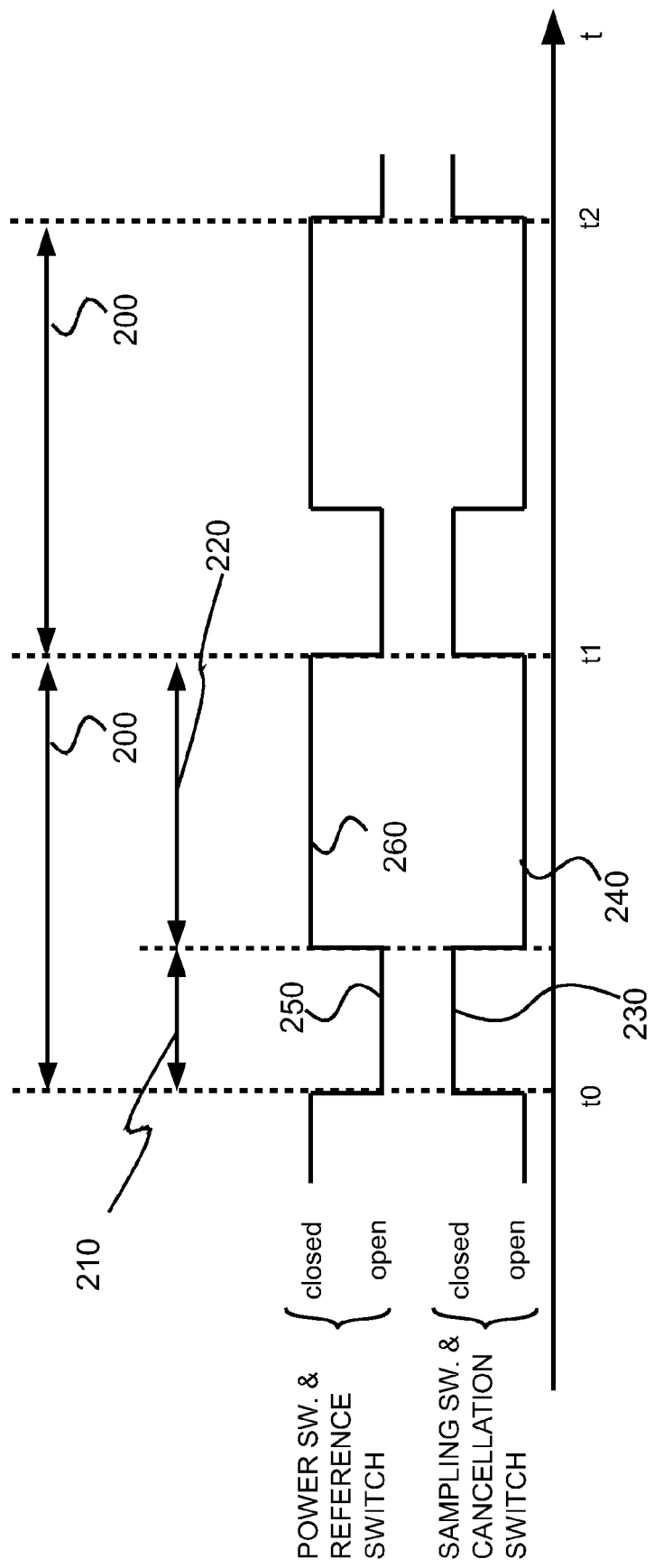
FIG. 2 is a time line showing switch states when operating the circuit shown in FIG. 1.

Operation of pre-charge sample-and-hold circuit 100 to provide an output voltage signal VOUT to some circuit such as an ADC circuit (not shown) that is coupled to output signal terminal 20 of pre-charge sample-and-hold circuit 100 is now described in more detail. Reference is made to FIG. 2 that shows a time line related to operation of pre-charge sample-and-hold circuit 100. FIG. 2 is a time line showing exemplary states of sampling switch 13 and of power supply switch 33.

Now with reference to FIG. 2, an operating cycle of pre-charge sample-and-hold circuit 100 is shown that lasts for a duration of time interval 200. The operating cycle encompasses at least operation in the sampling mode and operation in the holding mode.

When operating in the sampling mode, during a time interval 210, pre-charge sample-and-hold circuit 100 is in the acquisition state. Sampling switch 13 and cancellation switch 23, as shown at 230, are closed, while power supply switch 33 and reference voltage switch 43, as shown at 240, are open. Further, when operating in the hold state, during time interval 220, power supply switch 33 and reference voltage switch 43, as shown at 260, are closed while sampling switch 13 and cancellation switch 23, as shown at 250, are open. It should be understood that the skilled person will also contemplate other combinations of switch states. For example, transition between sampling mode and holding mode may, in some embodiments include a state where all switches 13, 23, 33 and 43 are open. At least one effect can be to avoid any 'overlapping' of switches being closed that could result in undesired short circuiting. Also, in some implementations timing of switching may not be so exact as to ensure synchronous switching.

Thus, during time interval 210, while operating in the acquisition state, sampling capacitance 18 is charged. Further, still while operating in the acquisition state, cancellation capacitance 38 is discharged via cancellation coupling 22 to charge sampling capacitance 18. Thus, by intermediary of cancellation capacitance 38, charge taken from power supply terminal 30 is used to charge sampling capacitance 18. Then, during time interval 220, while operating in the hold state, cancellation capacitance 38 is loaded with charge received from a power supply coupled to power supply terminal 30.

At least one effect can be that sampling capacitance 18 as 'seen' from input terminal 10 seems to be small so that little charge is required for charging sampling capacitance 18. Thus, at least one effect of the charge cancellation circuitry can be to keep charge fluctuations on sampling capacitance 18 low during acquisition state. In some embodiments, advantages can result in structural terms, since an implementation of the circuit, for example as an integrated circuit on a semiconductor substrate, can require less surface than a conventional circuit. In some embodiments, advantages can result in operational terms, in particular the circuit can require less power to be drawn from input voltage signal VIN than a conventional circuit since power, in accordance with the embodiments disclosed herein, is provided by supply voltage VDD. Thus, a high resistance signal input source can be implemented.

Figure 3:
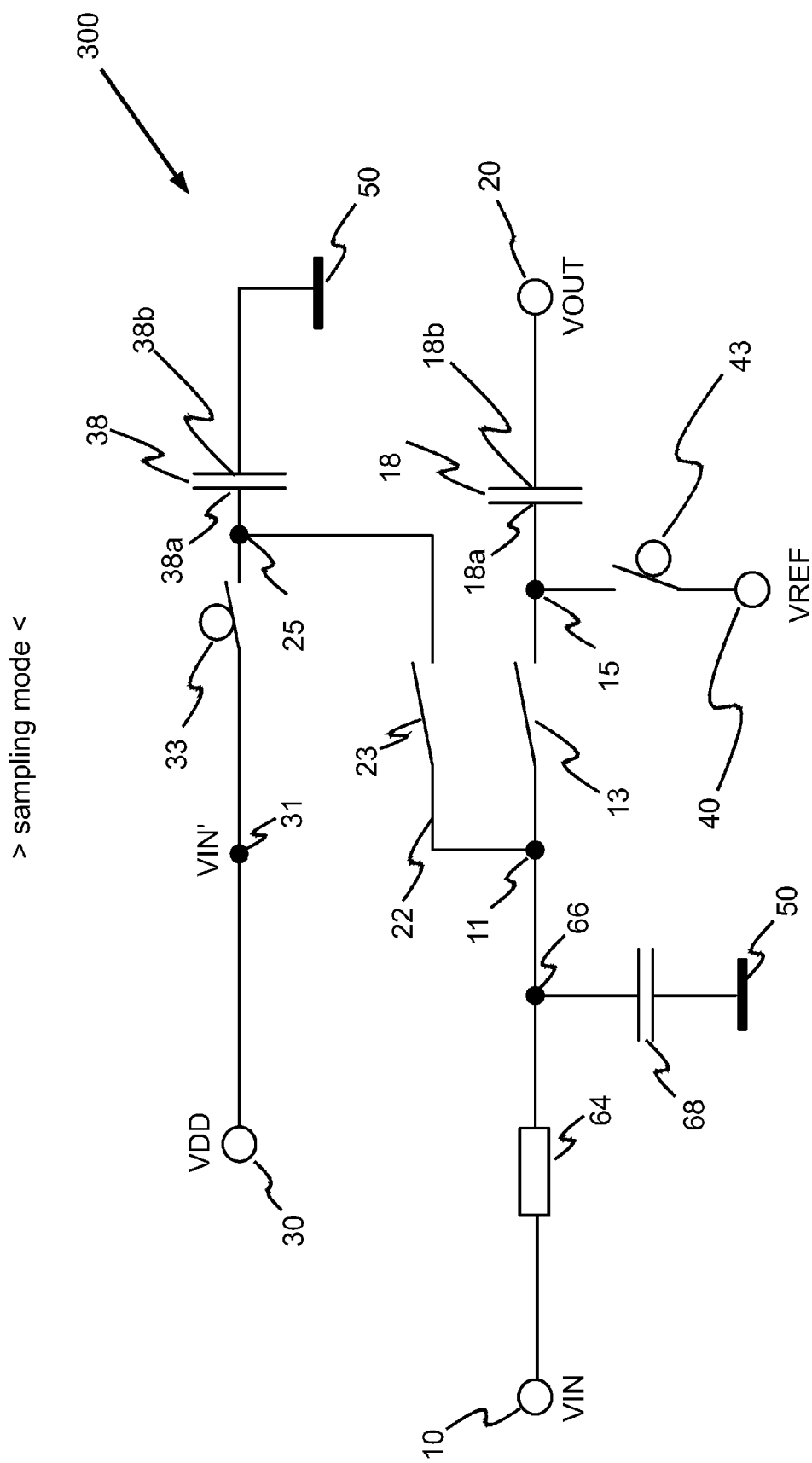
FIG. 3 is a diagram illustrating a further pre-charge sample-and-hold circuit according to some embodiments.

FIG. 3 illustrates a pre-charge sample-and-hold circuit 300 according to some further embodiments. In addition to circuit elements provided in the circuit arrangement according to embodiments discussed above with reference to FIG. 1, some embodiments include a tank capacitance 68. In some embodiments tank capacitance 68 is coupled, at a feed node 66 between input terminal 10 and branch node 11, to ground 50. Tank capacitance 68 is configured to provide a reservoir of charge to load sampling capacitance 20. At least one effect of implementations according to some embodiments can be, since less charge needs to be moved to tank capacitance 68 for replacement of charge taken from tank capacitance 68 to load sampling capacitance 18, switch times can be faster than in a conventional solution, whereby a higher sampling rate can be achieved than in a conventional solution.

Some embodiments further include a filter resistance 64 coupled between signal input terminal 10 and feed node 66. Filter resistance 64 can, for example, protect circuitry upstream of signal input terminal 10 against high voltage discharges. Together, filter resistance 64 and tank capacitance 68 can form an R/C input filter configured as a low pass filter that, for example, filters away currents caused by high frequency emissions that can occur in some typical application environments such as an automotive application environment. The R/C filter can also be configured as an anti-aliasing filter. In some embodiments, while pre-charge sample-and-hold circuit 300 is operated in sampling mode, since charge on cancellation capacitance 38 can flow to and thereby load sampling capacitance 18, little or even no charge flows from tank capacitance 68 to load sampling capacitance 18. At least one effect can be to ensure safe filter functionality of the R/C input filter provided by filter resistance 64 and filter capacitance 68.

Figure 4:
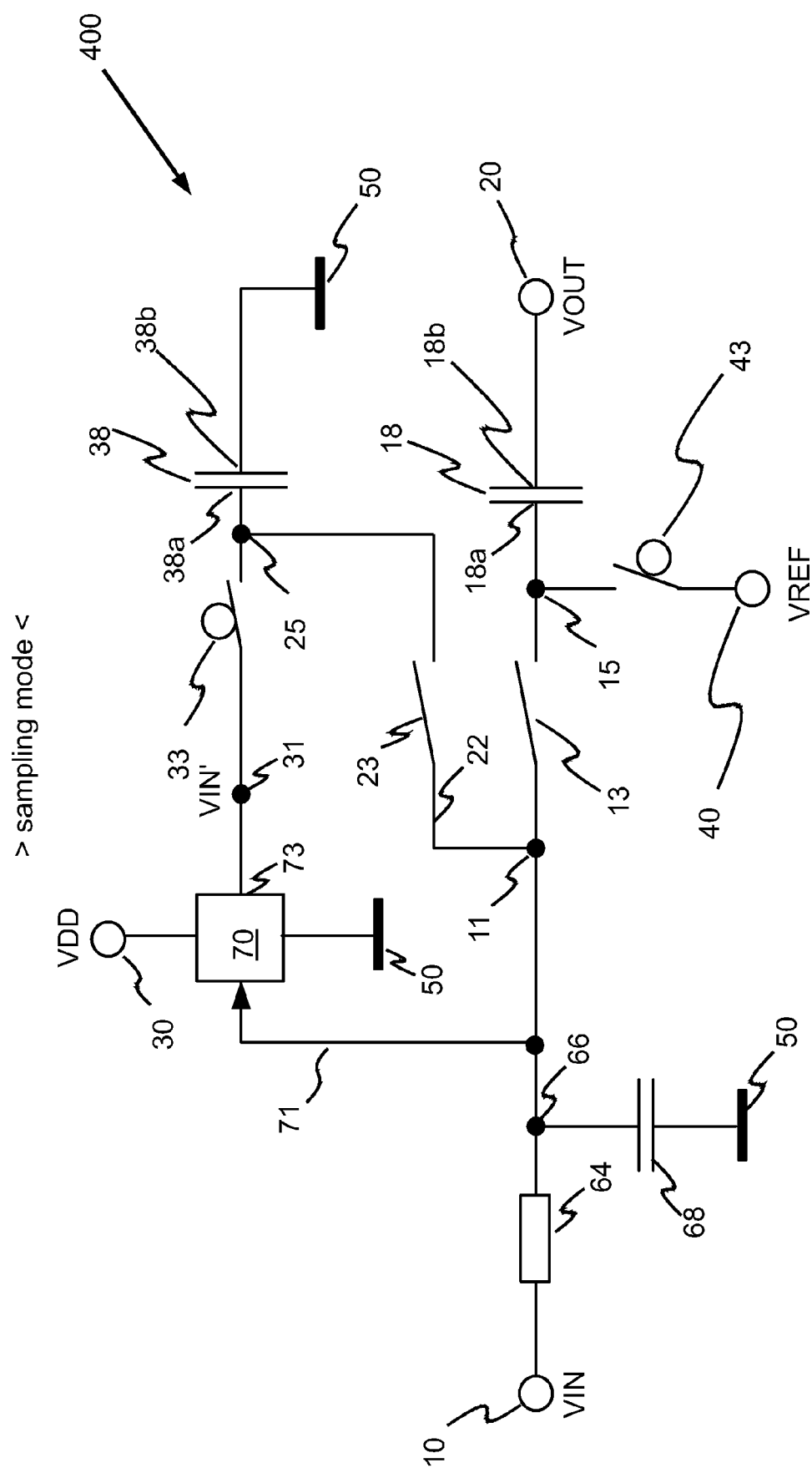
FIG. 4 is a diagram illustrating another pre-charge sample-and-hold circuit according to some embodiments.

FIG. 4 illustrates other variants of the embodiments discussed above. In some embodiments, pre-charge sample-and-hold circuit 400 includes a charge pump 70. In order to receive supply voltage VDD, charge pump 70 can be coupled between power supply terminal 30 and ground 50. In some implementations charge pump 70 can be controlled by input voltage signal VIN which is fed from signal input terminal 10 via a control line 71 to charge pump 70. An output 73 of charge pump 70 is configured to provide a feed voltage signal VIN' to power supply switch 33 that follows input voltage signal VIN by a factor that can, for example, depend in any given application on a specific manufacturing technology selected to manufacture an integrated circuit that incorporates techniques of the embodiments disclosed herein. In some implementations the factor is larger than 1, e.g., 1.25, 1.5 or 2, wherein the example numbers are not meant as limiting; the person skilled in the art can contemplate other values as needed or otherwise effective and/or efficient in a given application environment. It should be understood that, due to charge pump 70, supply voltage VDD does not need to exceed the level of maximum input voltage signal VIN as charge pump 70 can provide a pumped up voltage that exceeds supply voltage VDD. Thus, as the case may be, a maximum level of feed voltage signal VIN' can exceed the level of VDD.

Figure 5:
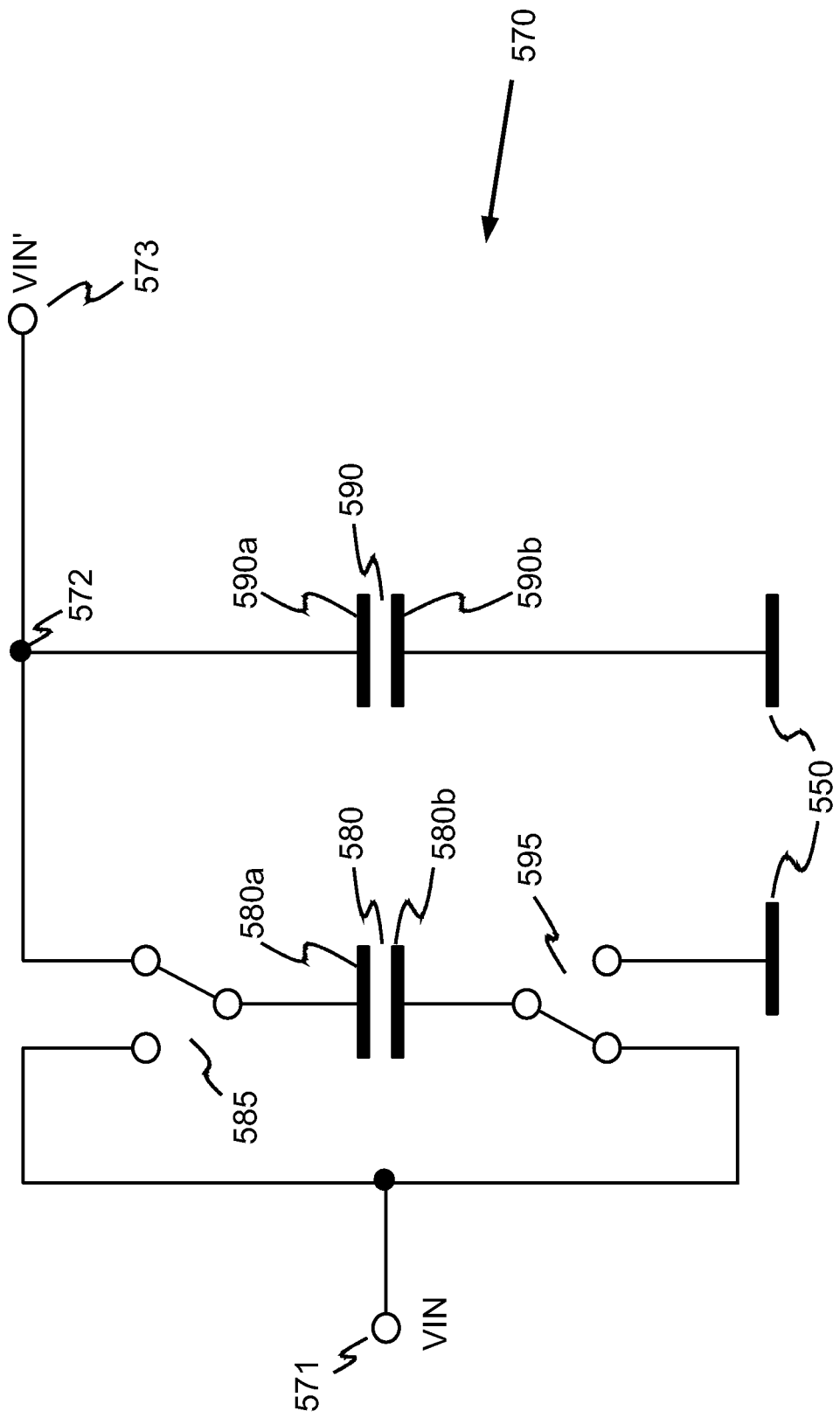
FIG. 5 is a diagram illustrating a charge pump configured for use with some embodiments of the pre-charge sample-and-hold circuit shown in FIG. 4.

FIG. 5 is a diagram illustrating a charge pump 570 configured for use with some embodiments of the pre-charge sample-and-hold circuit shown in FIG. 4. In some embodiments charge pump 570 comprises at least two capacitances, a first pump capacitance 580 and a second pump capacitance 590, that are coupled in series. In an embodiment a first terminal 580a of first capacitance 580 is coupled via a first switch 585, in a first switch state (not shown), to an input terminal 571 of charge pump 570, or, in a second switch state (as shown in FIG. 5), to a first terminal 590a of second capacitance 590. A second terminal 580b of first capacitance 580 is coupled via a second switch 595 to input terminal 571 (as shown in FIG. 5) or to ground 550. A second terminal 590b of second capacitance 590 is coupled to ground 550. In an embodiment (not shown) cancellation capacitance 38 of pre-charge sample-and-hold circuit 400 is configured as second pump capacitance 590. In some embodiments input terminal 571 can also be configured to supply power. Coupling between first capacitance 580 and second capacitance 590 in some implementations includes a node 572 to an output terminal 573 of charge pump 570. Second pump capacitance 590 can be larger than first pump capacitance 580. At least one effect is that a voltage level at node 572 can be larger than at input terminal 571.

In an implementation charge pump 570 is operated by setting VIN to a first voltage level, for example, VIN=5V. In the first state (not shown in FIG. 5), first capacitance 580 is thus charged to a voltage level equal to the input voltage VIN, i.e. to 5V. In the second state (as shown in FIG. 5), first switch 585 and second switch 590 of charge pump 570 are reconfigured so that first capacitance 580 and second capacitance 590 are coupled in series as already described above, from input terminal 571 to output terminal 573.

In some embodiments charge pump 570 is provided with switch circuitry (not shown in FIG. 5) configured to receive a control signal and switch charge pump 570 on/off according to the control signal. Some implementations are configured for control of switching between first state and second state by a clock signal received from a clock gate (not shown). In an embodiment the clock gate can be configured to deliver clock pulses to first switch 585 and to second switch 595 of charge pump 570 as long as a desired level of feed voltage signal VIN' is not yet achieved. Further, the clock gate can be configured to stop delivery of clock pulses to charge pump 570, once the desired level feed voltage signal VIN' is reached. In some embodiments a voltage level at output terminal 573 equals the sum of input voltage VIN and a voltage provided by charge stored on first capacitance 580. Neglecting leakage effects, charge pump 570 thus, at output terminal 573, can provide a voltage VIN' of up to double the input voltage VIN.

Now referring back to FIG. 4, when operating pre-charge sample-and-hold circuit 400 in the holding mode with power supply switch 33 being closed, charge pump 70 can provide feed voltage signal VIN' to load charges on cancellation capacitance 38. For example, charge pump 70 can be used to provide feed voltage VIN' at double the level of input voltage signal VIN and to charge cancellation capacitance 38 accordingly. In embodiments where cancellation capacitance 38 is twice as large as sampling capacitance 18, upon switching from holding mode to sampling mode, in an ideal case no charge would be removed from tank capacitance 68, since charges on sampling capacitance 18 and cancellation capacitance 38 would exactly cancel each. In practice, where exact cancellation may not always be achieved, typically, when comparing the embodiments disclosed herein with a conventional solution, relatively little charge is removed from tank capacitance 68. At least one effect is that, 'seen' from signal input terminal 10, sampling capacitance 18 appears small. Thus, advantages can be achieved in terms of large R/C filter bandwidth and a high sampling rate. The skilled person will implement other values of cancellation capacitance 38 and operate pre-charge sample-and-hold circuit 400 at other levels of feed voltage signal VIN' at cancellation charge feed point 31, as the case may be, in order to achieve at least some of the afore-mentioned advantages. In some embodiments, for example, cancellation capacitance 38 is selected to be four times the sampling capacitance 18. The person skilled in the art will contemplate other multiples, integer or fractional, for example, 2 or 8, wherein the skilled person can be guided by considerations related to matching capacitance values to each other.

Figure 6:
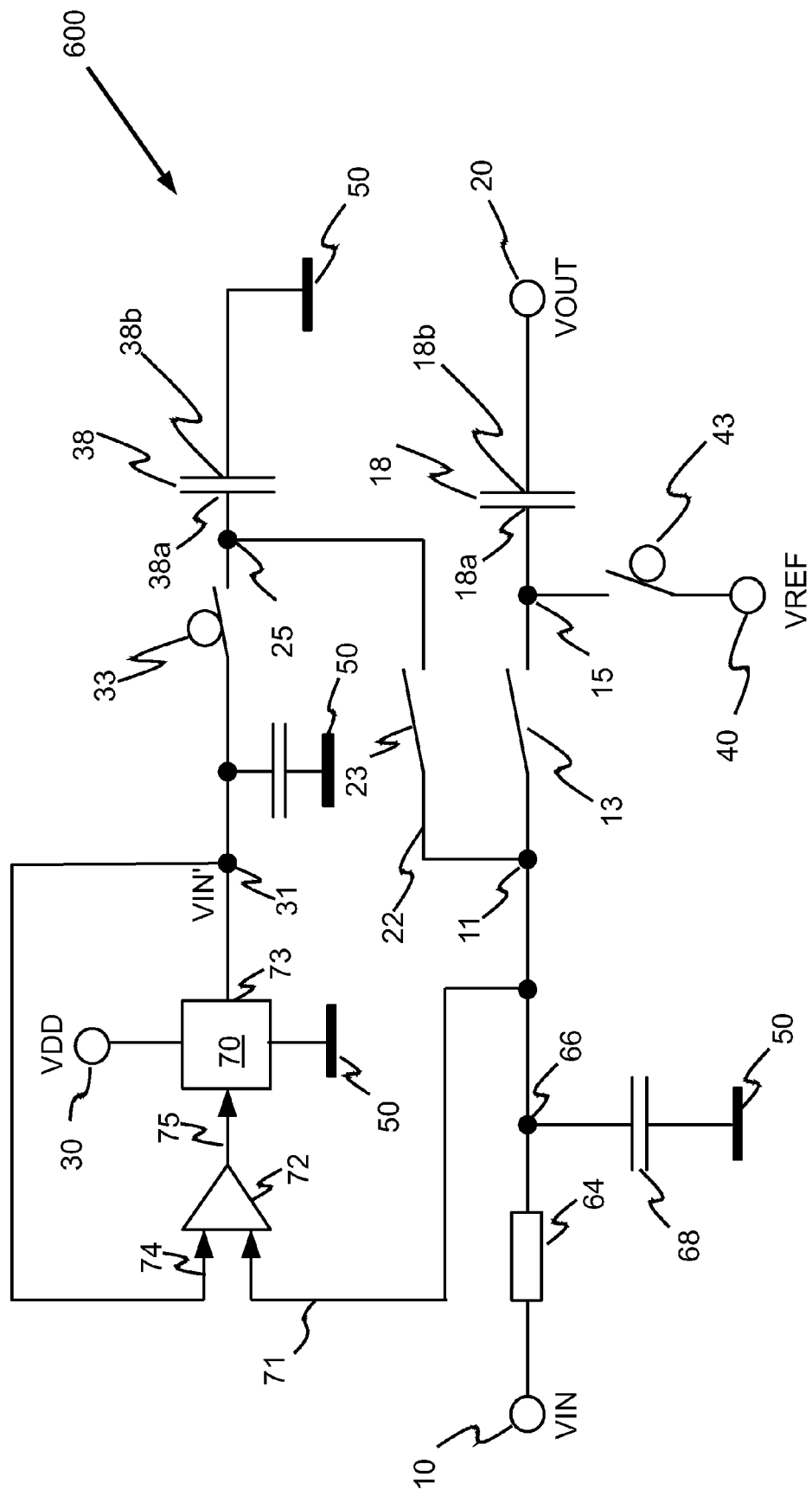
FIG. 6 is a diagram illustrating yet another pre-charge sample-and-hold circuit according to some embodiments.

FIG. 6 is a diagram illustrating yet another pre-charge sample-and-hold circuit 600 according to some embodiments. Pre-charge sample-and-hold circuit 600 includes elements of pre-charge sample-and-hold circuit 400 illustrated in FIG. 4. Further, pre-charge sample-and-hold circuit 600 comprises a comparator 72 configured to compare input voltage signal VIN to feed voltage signal VIN' and to provide a control signal to charge pump 70. Comparator 72 has a first input terminal configured to receive input voltage signal VIN on a voltage input line 71 coupled to signal input terminal 10. Comparator 72 has a second input terminal configured to receive feed voltage signal VIN' via a feed back line 74 coupled to output terminal 73 of charge pump 70. Thus, according to some embodiments, comparator 72 is configured to provide the control signal to charge pump 70 in order to switch off charge pump 70 once feed voltage signal VIN' reaches a voltage level equal to a predetermined multiple of input voltage signal VIN. For example, comparator 72 can be configured to output the control signal to switch off charge pump 70 when feed voltage signal VIN' is double the input signal voltage. In some embodiments (not shown in FIG. 6) comparator 72 is configured to compare feed voltage signal VIN' that is output from charge pump 70 to some predetermined reference voltage and to output the control signal so as to switch off charge pump 70 when feed voltage signal VIN' of the charge pump 70 reaches the predetermined reference voltage level.

In some implementations the pre-charge sample-and-hold circuit has an input terminal configured to receive an input voltage signal, a reference voltage terminal configured to be set to a reference voltage, an output terminal configured to output a sample voltage, and a sampling capacitance. The sampling capacitance can be coupled between the input terminal and the reference voltage terminal. In some embodiments the sampling capacitance is configured to provide the sample voltage when the sample-and-hold circuit is in a holding mode, and a cancellation capacitance configured to be charged when the sample-and-hold circuit is in the holding mode and, when the sample-and-hold circuit is in a sampling mode, to charge the sampling capacitance. At least one effect can be that sampling capacitance as seen from the input terminal appears to be small.

In some embodiments of the pre-charge sample-and-hold circuit the input terminal comprises a high-resistance circuitry. In some embodiments the input terminal comprises a low-pass filter circuitry. In some embodiments the cancellation capacitance has a larger capacitance value than the sampling capacitance.

Some embodiments of the pre-charge sample-and-hold circuit further comprise one or more of: a supply voltage terminal configured to be set to a supply voltage, a first switch coupled between the cancellation capacitance and the supply voltage terminal, a second switch coupled between the input terminal and the cancellation capacitance, a third switch coupled between the input terminal and the sampling capacitance, and a fourth switch coupled between the sampling capacitance and the reference voltage terminal. In some embodiments the circuit is configured to have, in the holding mode, the first switch and the fourth switch closed and the second switch and the third switch opened. Further, in some embodiments the circuit is configured to have, in the sampling mode, the second switch and the third switch closed and the first switch and the fourth switch opened.

In some embodiments the cancellation capacitance is coupled between the supply voltage terminal and ground. In some embodiments the supply voltage terminal is configured to be set to the supply voltage being double the input voltage.

Some embodiments further comprise charge pump circuitry coupled between the supply voltage terminal and ground and further being coupled between the input voltage terminal and the first switch, wherein the charge pump circuit is configured to set the cancellation capacitance to a cancellation voltage that exceeds the input voltage. In some embodiments the charge pump circuitry is configured to provide the cancellation voltage as double the input voltage. Some embodiments further comprise a comparator having a first comparator input coupled to the input voltage terminal and a second comparator input coupled to an output of the charge pump circuitry, and a comparator output coupled to the charge pump, wherein the comparator is configured to compare the input voltage to the cancellation voltage and to signal when the cancellation voltage reaches a predetermined voltage level.

In some implementations of the method for charging a sampling capacitance of a pre-charge sample-and-hold circuit, charging the sampling capacitance uses charge on the cancellation capacitance. Some embodiments comprise selecting a capacitance of the cancellation capacitance to be larger than a capacitance of the sampling capacitance. Some embodiments further comprise at least one of setting the supply voltage terminal to a supply voltage, in a holding mode, closing the first switch and the fourth switch and opening the second switch and the third switch, and in a sampling mode, closing the second switch and the third switch and opening the first switch and the fourth switch. Some embodiments include setting the supply voltage to double the input voltage. Some embodiments include using the supply voltage between the supply voltage terminal and ground to charge the cancellation capacitance. Some embodiments further comprise pumping up the input voltage to provide a cancellation voltage that exceeds the input voltage. Some embodiments include using the cancellation voltage to charge the cancellation capacitance. In some embodiments the cancellation voltage is provided as double the input voltage. Some embodiments further comprise comparing the input voltage to the cancellation voltage. Some embodiments further comprise signaling when the cancellation voltage reaches a predetermined voltage level.

The word 'exemplary' is used herein to mean serving as an example, instance, or illustration. Any aspect or design described herein as 'exemplary' is not necessarily to be construed as preferred or advantageous over other aspects or designs. Rather, use of the word exemplary is intended to present concepts and techniques in a concrete fashion. The term 'techniques,' for instance, may refer to one or more devices, apparatuses, systems, methods, articles of manufacture, and/or computer-readable instructions as indicated by the context described herein. As used in this application, the term or is intended to mean an inclusive or rather than an exclusive 'or.' That is, unless specified otherwise or clear from context, 'X employs A or B' is intended to mean any of the natural inclusive permutations. That is, if X employs A. The articles 'a' and an as used in this application and the appended claims should generally be construed to mean 'one or more', unless specified otherwise or clear from context to be directed to a singular form. For the purposes of this disclosure and the claims, the terms 'coupled' and 'connected' may have been used to describe how various elements interface. Such described interfacing of various elements may be either direct or indirect.

It is to be understood that the features of the various embodiments described herein may be combined with each other, unless specifically noted otherwise. Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. It is intended that this invention be limited only by the claims and the equivalents thereof. Exemplary implementations/embodiments discussed herein may have various components collocated. The implementations herein are described in terms of exemplary embodiments. However, it should be appreciated that individual aspects of the implementations may be separately claimed. In some instances, well-known features are omitted or simplified to clarify the description of the exemplary implementations. In the above description of exemplary implementations, for purposes of explanation, specific numbers, materials configurations, and other details are set fourth in order to better explain the invention, as claimed. However, it will be apparent to one skilled in the art that the claimed invention may be practiced using different details than the exemplary ones described herein. The inventor intends the described exemplary embodiments/implementations to be primarily examples. The inventor contemplated that the claimed invention might also be embodied and implemented in other ways, in conjunction with other present or future technologies. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. While a particular feature of the disclosure may have been disclosed with respect to only one of several implementations, such feature may be combined with one or more other features of the other implementations as may be desired and advantageous for any given or particular application.

What is claimed is:

1. A pre-charge sample-and-hold circuit, comprising:
an input terminal configured to receive an input voltage signal;
a reference voltage terminal configured to be set to a reference voltage;
an output terminal configured to output a sample voltage;
a sampling capacitance coupled between the input terminal and the reference voltage terminal and configured to provide the sample voltage when said sample-and-hold circuit is in a holding mode; and
a cancellation capacitance configured to be charged when said sample-and-hold circuit is in the holding mode and, when said sample-and-hold circuit is in a sampling mode, to charge said sampling capacitance.

2. The pre-charge sample-and-hold circuit of claim 1, wherein said input terminal comprises a high-resistance circuitry.

3. The pre-charge sample-and-hold circuit of claim 1, wherein said input terminal comprises a low-pass filter circuitry.

4. The pre-charge sample-and-hold circuit of claim 1, wherein said cancellation capacitance has a larger capacitance than said sampling capacitance.

5. The pre-charge sample-and-hold circuit of claim 1, further comprising:
a supply voltage terminal configured to be set to a supply voltage;
a first switch coupled between said cancellation capacitance and said supply voltage terminal;
a second switch coupled between said input terminal and said cancellation capacitance;
a third switch coupled between said input terminal and said sampling capacitance; and
a fourth switch coupled between said sampling capacitance and said reference voltage terminal, wherein the circuit is configured to have,
in said holding mode, said first switch and said fourth switch closed and said second switch and said third switch opened, and,
in said sampling mode, said second switch and said third switch closed and said first switch and said fourth switch opened.

6. The pre-charge sample-and-hold circuit of claim 5, wherein said cancellation capacitance is coupled between said supply voltage terminal and ground.

7. The pre-charge sample-and-hold circuit of claim 5, wherein said supply voltage terminal is configured to be set to said supply voltage being double said input voltage.

8. The pre-charge sample-and-hold circuit of claim 5, further comprising charge pump circuitry coupled between said supply voltage terminal and ground and further being coupled between said input voltage terminal and said first switch, wherein said charge pump circuit is configured to set said cancellation capacitance to a cancellation voltage that exceeds said input voltage.

9. The pre-charge sample-and-hold circuit of claim 8, wherein said charge pump circuitry is configured to provide said cancellation voltage as double said input voltage.

10. The pre-charge sample-and-hold circuit of claim 8, further comprising:
a comparator having a first comparator input coupled to said input voltage terminal and a second comparator input coupled to an output of said charge pump circuitry; and
a comparator output coupled to said charge pump circuitry, the comparator being configured to compare said input voltage to said cancellation voltage and to signal when said cancellation voltage reaches a predetermined voltage level.

11. An analog/digital converter comprising a sample-and-hold circuit having an input terminal configured to receive an input voltage signal;
a reference voltage terminal configured to be set to a reference voltage;
an output terminal configured to output a sample voltage;
a sampling capacitance coupled between the input terminal and the reference voltage terminal and configured to provide the sample voltage when said sample-and-hold circuit is in a holding mode; and
a cancellation capacitance configured to be charged when said sample-and-hold circuit is in the holding mode and to charge said sampling capacitance when said sample-and-hold circuit is in a sampling mode.

12. The analog/digital converter of claim 11, wherein said cancellation capacitance has a larger capacitance than said sampling capacitance.

13. A method for charging a sampling capacitance of a sample-and-hold circuit, the method comprising:
charging a cancellation capacitance when said sample-and-hold circuit is in a holding mode; and
charging said sampling capacitance when said sample-and-hold circuit is in a sampling mode,
wherein said charging said sampling capacitance uses charge on said cancellation capacitance.

14. The method of claim 13, further comprising selecting a capacitance of said cancellation capacitance to be larger than a capacitance of said sampling capacitance.

15. The method of claim 13, wherein said sample-and-hold circuit comprises:
a supply voltage terminal;
a first switch coupled between said cancellation capacitance and said supply voltage terminal;
a second switch coupled between said input terminal and said cancellation capacitance;
a third switch coupled between said input terminal and said sampling capacitance; and
a fourth switch coupled between said sampling capacitance and said reference voltage terminal,
said method further comprising:
setting said supply voltage terminal to a supply voltage;
in said holding mode, closing said first switch and said fourth switch and opening said second switch and said third switch; and
in said sampling mode, closing said second switch and said third switch and opening said first switch and said fourth switch.

16. The method of claim 15, wherein said supply voltage is set to double said input voltage.

17. The method of claim 15, wherein said cancellation capacitance is charged by said supply voltage between said supply voltage terminal and ground.

18. The method of claim 13, further comprising:
pumping up said input voltage to provide a cancellation voltage that exceeds said input voltage; and using said cancellation voltage to charge said cancellation capacitance.

19. The method of claim 18, wherein said cancellation voltage is provided as double said input voltage.

20. The method of claim 19, further comprising:
comparing said input voltage to said cancellation voltage; and
signaling when said cancellation voltage reaches a predetermined voltage level.

* * * * *